(12) United States Patent
Park et al.

(10) Patent No.: US 9,472,746 B2
(45) Date of Patent: Oct. 18, 2016

(54) VIBRATOR

(71) Applicant: SAMSUNG ELECTRO-MECHANICS CO., LTD., Suwon (KR)

(72) Inventors: Yun Yeong Park, Suwon (KR); Dong Woo Rhee, Suwon (KR); Dong Yeon Shin, Suwon (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 308 days.

(21) Appl. No.: 14/024,492

(22) Filed: Sep. 11, 2013

(65) Prior Publication Data

US 2015/0008793 A1     Jan. 8, 2015

(30) Foreign Application Priority Data

Jul. 2, 2013  (KR) .......................... 10-2013-0077285

(51) Int. Cl.
| | | |
|---|---|---|
| H01L 41/09 | (2006.01) | |
| H01L 41/053 | (2006.01) | |
| B06B 1/06 | (2006.01) | |
| G06F 3/01 | (2006.01) | |

(52) U.S. Cl.
CPC ........... *H01L 41/053* (2013.01); *B06B 1/0648* (2013.01); *G06F 3/016* (2013.01)

(58) Field of Classification Search
CPC . H01L 41/053; H01L 41/09; H01L 41/0926; H03H 9/1021
USPC ........... 310/323.01, 328, 329, 344, 345, 348
See application file for complete search history.

(56) References Cited

U.S. PATENT DOCUMENTS

| | | | | |
|---|---|---|---|---|
| 5,610,468 A | * | 3/1997 | Miyazawa | ............... G04C 3/12 310/323.08 |
| 7,633,207 B2 | * | 12/2009 | Sakamoto | .............. H02N 2/004 310/323.01 |
| 2006/0113868 A1 | * | 6/2006 | Sakatani | ................... G02B 7/08 310/323.17 |
| 2011/0163635 A1 | | 7/2011 | Kim | |
| 2011/0199696 A1 | * | 8/2011 | Lee | .......................... G02B 7/08 359/824 |
| 2012/0212100 A1 | * | 8/2012 | Lee | ........................ H01L 41/053 310/317 |

(Continued)

FOREIGN PATENT DOCUMENTS

| | | |
|---|---|---|
| CN | 1525636 A | 9/2004 |
| CN | 1714597 A | 12/2005 |
| CN | 102233320 A | 11/2011 |

(Continued)

OTHER PUBLICATIONS

Office Action dated Aug. 19, 2014 for Korean Patent Application No. 10-2013-0077285 and its English summary provided by Applicant's foreign counsel.
SIPO Office Action for Chinese Application No. 201310449943.8 which corresponds to the above-referenced U.S. application.
KIPO Notice of Allowance for Korean Application No. 10-2013-0077285 which corresponds to the above-referenced U.S. application.

*Primary Examiner* — Derek Rosenau
*Assistant Examiner* — Bryan Gordon
(74) *Attorney, Agent, or Firm* — LRK Patent Law Firm

(57) ABSTRACT

There is provided a vibrator including: a housing including an internal space; an elastic member mounted within the internal space so as to be elastically deformed; and a piezo actuator mounted on one surface of the elastic member, wherein the elastic member includes a reinforcement emboss protruding toward a surface opposite to a surface on which the piezo actuator is mounted in a portion on which the piezo actuator is mounted.

12 Claims, 15 Drawing Sheets

(56) References Cited

U.S. PATENT DOCUMENTS

2013/0147978 A1* 6/2013 Ohashi ................ G02B 27/646
 348/208.7
2014/0077661 A1* 3/2014 Smirnov ............... B06B 1/0651
 310/329

FOREIGN PATENT DOCUMENTS

| KR | 10-1044130 | 6/2011 |
| KR | 10-1157868 B1 | 6/2012 |
| KR | 10-1241030 B1 | 3/2013 |
| KR | 10-1250291 B1 | 4/2013 |

* cited by examiner

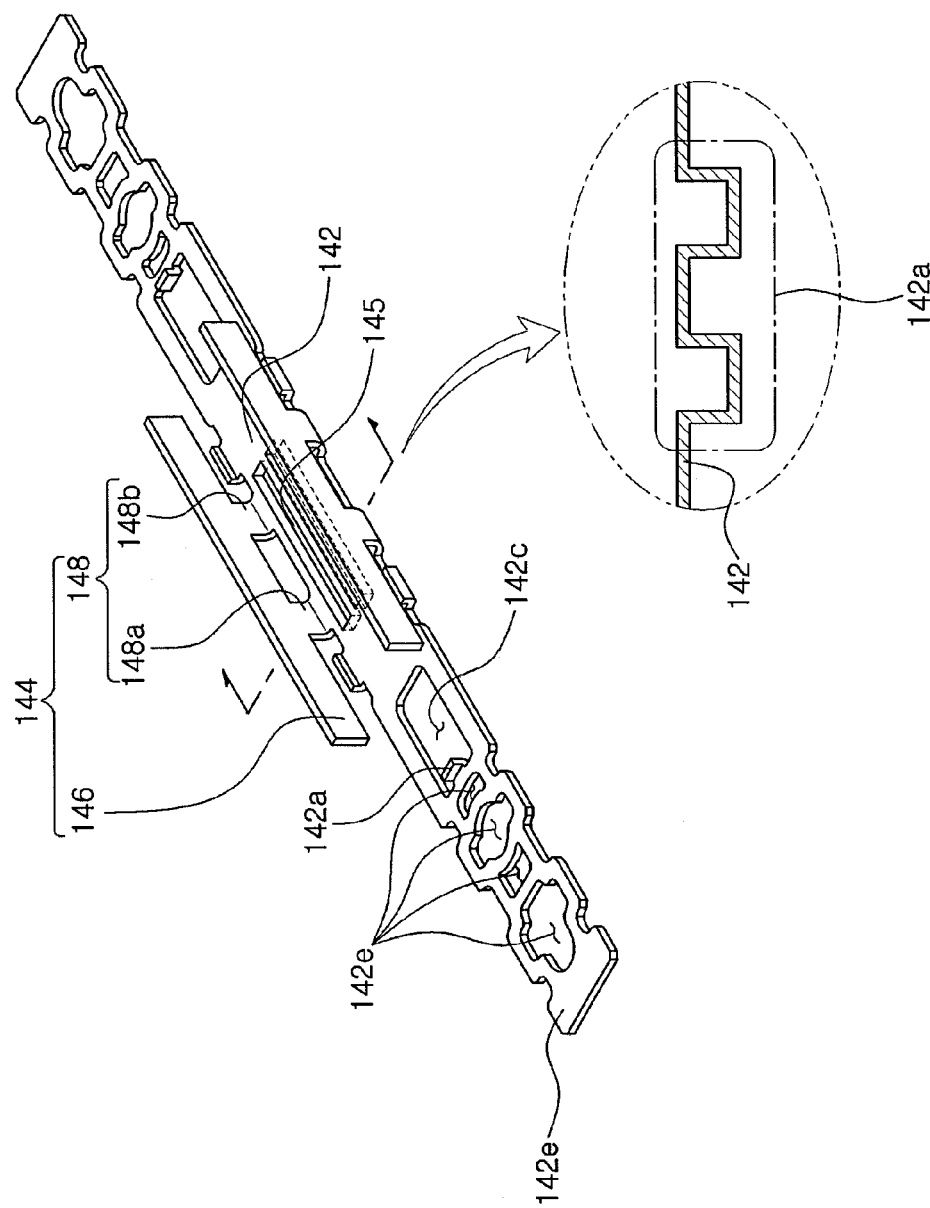

VIBRATOR

CROSS-REFERENCE TO RELATED APPLICATIONS

This application claims the benefit of Korean Patent Application No. 10-2013-0077285 filed on Jul. 2, 2013, with the Korean Intellectual Property Office, the disclosure of which is incorporated in its entirety herein by reference.

BACKGROUND OF THE INVENTION

1. Field of the Invention

The present invention relates to a vibrator.

2. Description of the Related Art

A vibrator, a device converting electrical energy into mechanical vibrations using the principle of the generation of electromagnetic force, is mounted in a mobile phone, or the like, to be used for silently notifying a user of call reception. In addition, as the market for mobile devices such as mobile phones, and the like, has rapidly expanded and various additional functions have been added to mobile devices, a mobile device having a small size and high quality has been required. In this situation, the need for developing a vibrator having novel structure capable of overcoming disadvantages of existing products and significantly improved quality has increased.

Further, as the release onto the market of smartphones, among other mobile phones, has rapidly increased, a touchscreen scheme has been adopted for use therewith, such that the adoption of vibration motors has increased in order to generate vibrations to provide feedback when a user touches a smartphone. Vibrational performance required when a touchscreen is touched is as follows. First, as the amount of vibrations generation at the time of the touch is increased to be greater than that of vibrations generated at the time of call reception, an operation lifespan is required to be increased. Second, in order to increase user satisfaction when a user is provided with vibrations at the time of a touch, a vibration response speed needs to be increased in accordance with a touch speed of the screen.

As a product capable of implementing the characteristics as described above, there is provided a piezo haptic actuator. Such a piezo haptic actuator uses the principle of a converse piezoelectric effect, which generates displacement of a piezo element when a voltage is applied thereto, and vibratory force is generated by allowing a mass body provided on a moving element to move by the generated displacement.

A vibrator having such a structure may be characterized in that a frequency band width allowing for vibration force to be obtained at a predetermined level or more is wider, such that stable vibrational characteristics may be implemented, and vibrations having a high or a low frequency, rather than a single frequency, may be variously used within a predetermined frequency range. In addition, since rapid operational response characteristics may be implemented, the vibrator as described above may be suitable for implementing haptic vibrations in mobile devices such as mobile phones, and the like.

Meanwhile, the piezo element generating the vibration as described above may be mounted on an elastic member to vibrate, but there may be a problem in that the elastic member may be damaged by inertial force of a mass body mounted on the elastic member when external impacts are applied thereto (particularly, in an axial direction).

SUMMARY OF THE INVENTION

An aspect of the present invention provides a vibrator capable of preventing an elastic member from being damaged.

According to an aspect of the present invention, there is provided a vibrator including: a housing including an internal space; an elastic member mounted within the internal space so as to be elastically deformed; and a piezo actuator mounted on one surface of the elastic member, wherein the elastic member includes a reinforcement emboss protruding toward a surface opposite to a surface on which the piezo actuator is mounted in a portion on which the piezo actuator is mounted.

The reinforcement emboss may be continuously provided in a length direction of the elastic member.

The reinforcement emboss may be provided so as to be shorter than the piezo actuator in a length direction.

The elastic member may include a bottom plate having the piezo actuator is mounted on a surface thereof and an extension plate extended in a height direction from both edges of the bottom plate in a width direction.

The extension plate may include a connection part having one end connected to the bottom plate and extended in the height direction from a central portion of the bottom plate in the length direction and a support plate part provided in the length direction at the other end of the connection part to guide a mass body.

The reinforcement emboss may be provided so as to be shorter than the piezo actuator in the length direction and longer than a length between both ends of the connection part in the length direction.

The reinforcement emboss may be provided so that both ends thereof are positioned outwardly from both ends of the connection part in the length direction, respectively.

The reinforcement emboss may have a rectangular shape.

The reinforcement emboss may have a triangular shape.

The reinforcement emboss may have a round shape.

At least one pair of the reinforcement embosses may be provided in a width direction.

According to another aspect of the present invention, there is provided a vibrator including: a housing including an internal space; an elastic member mounted within the internal space; and a piezo actuator mounted on one surface of the elastic member to deform the elastic member, wherein the elastic member includes a bottom plate having the piezo actuator is mounted on a surface thereof, a connection part having one end connected to the bottom plate and extended in the height direction from a central portion of the bottom plate in a length direction, and a support plate part provided in the length direction at the other end of the connection part to guide a mass body, the bottom plate including a reinforcement emboss in the length direction so as to prevent a portion connected to the connection part in the bottom plate from being damaged.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
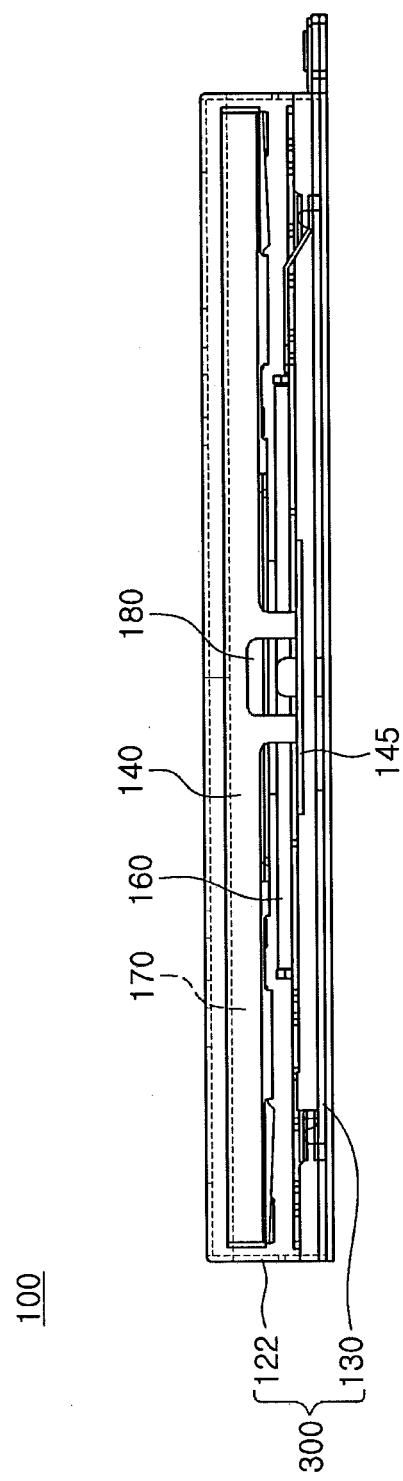
FIG. 1 is a cross-sectional view of a vibrator according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

A vibrator 100 according to an embodiment of the present invention may be a vibrator has a shape in which a mass body is adhered to a piezo element by interposing a cushioning material having adhesive force between the mass body disposed to face the piezo element and the piezo element. In this case, the piezo element is installed on a surface (for example, an upper surface) of an elastic member, such that a problem such as damage to the piezo element due to contact with the elastic member when external impacts are applied thereto may be solved.

Figure 2:
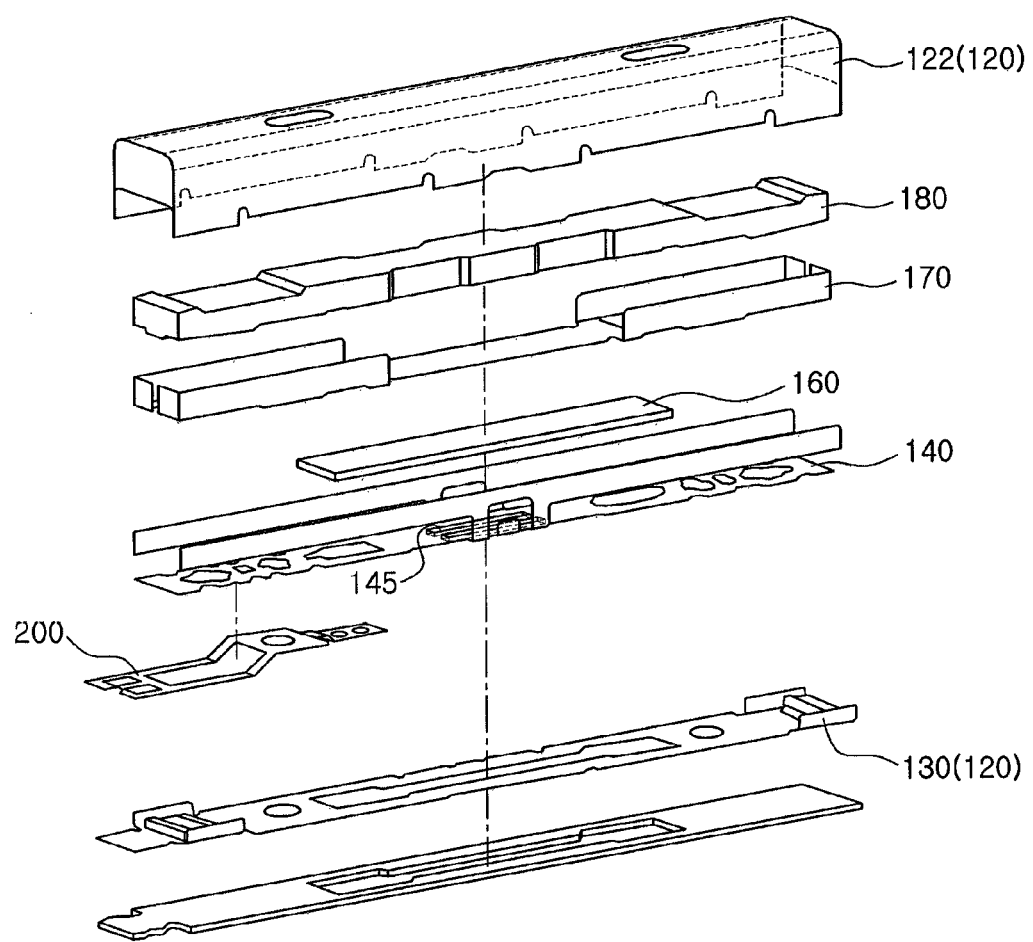
FIG. 2 is an exploded perspective view of the vibrator according to the embodiment of the present invention.

FIG. 1 is a cross-sectional view of a vibrator according to an embodiment of the present invention, and FIG. 2 is an exploded perspective view of the vibrator according to the embodiment of the present invention.

Referring to FIGS. 1 and 2, the vibrator 100 may include a housing 120 including an upper case 122 and a lower case 130, an elastic member 140, a piezo element 160, a mass body 180, and a circuit board 200.

Figure 3:
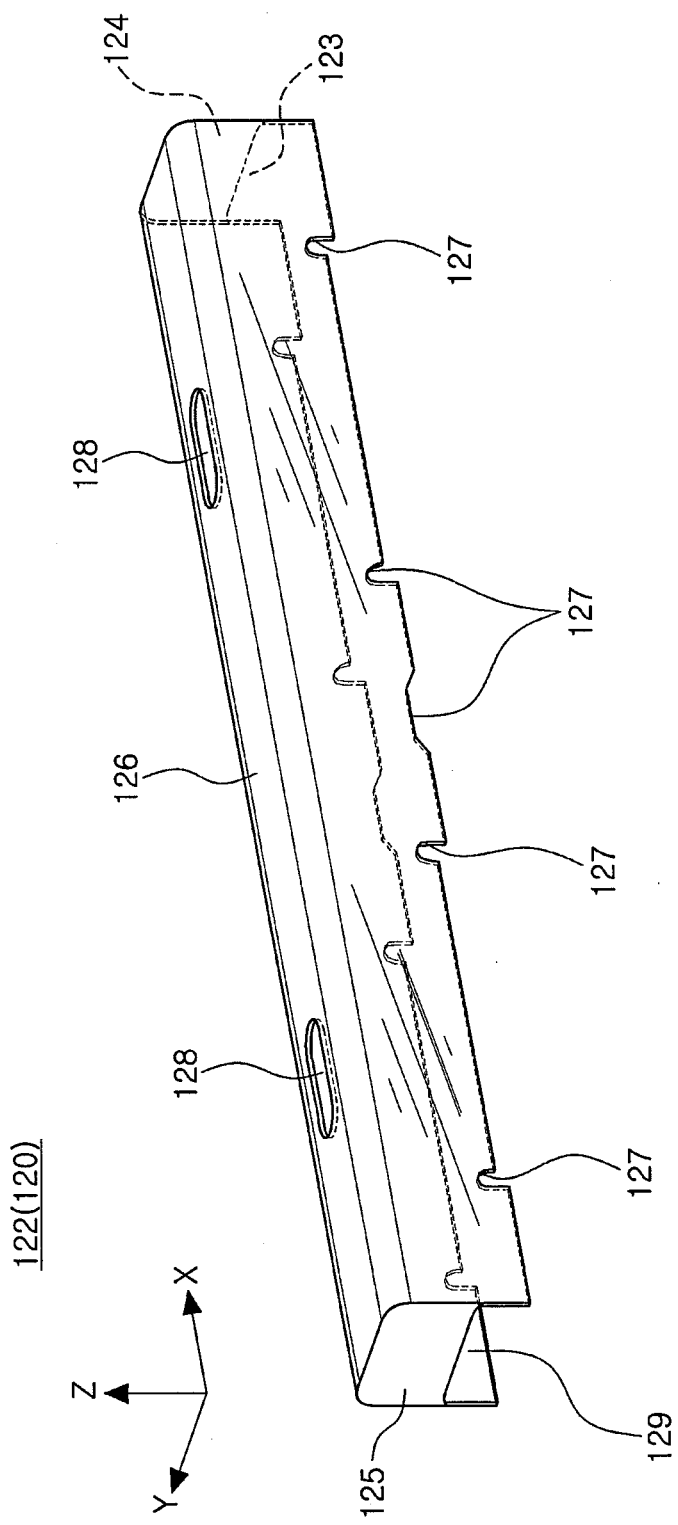
FIG. 3 is a perspective view of an upper case of the vibrator according to the embodiment of the present invention.

The housing 120 may include the upper and lower cases 122 and 130. In addition, the upper case 122 may have a box shape having an internal space, and the lower case 130 may have a plate shape. FIG. 3 is a perspective view illustrating the upper case 122 of the housing 120.

In addition, as described above, the upper case 122 may have the box shape. That is, the upper case 122 may be configured of a front plate 123, side plates 124 and 125, a rear plate 129, and an upper plate 126. Further, at least one of both side plates 124 and 125 may be formed to have a length shorter than those of the front plate 123 and the rear plate 129 in a height direction to thereby form an opening.

In addition, a plurality of grooves 127 for coupling with the lower case 130 may be formed in the front plate 123 and the rear plate 129.

Further, vent holes 128 for movement of air may be formed in the upper plate 126.

Here, terms with respect to directions will be defined. A length direction refers to an X direction of FIG. 3, and a width direction refers to a Y direction of FIG. 3. In addition, a height direction refers to a Z direction of FIG. 3. Further, the terms defined as described above will be equally used below. That is, in describing each configuration, terms used therefor will refer to the same directions as those described above.

Figure 4:
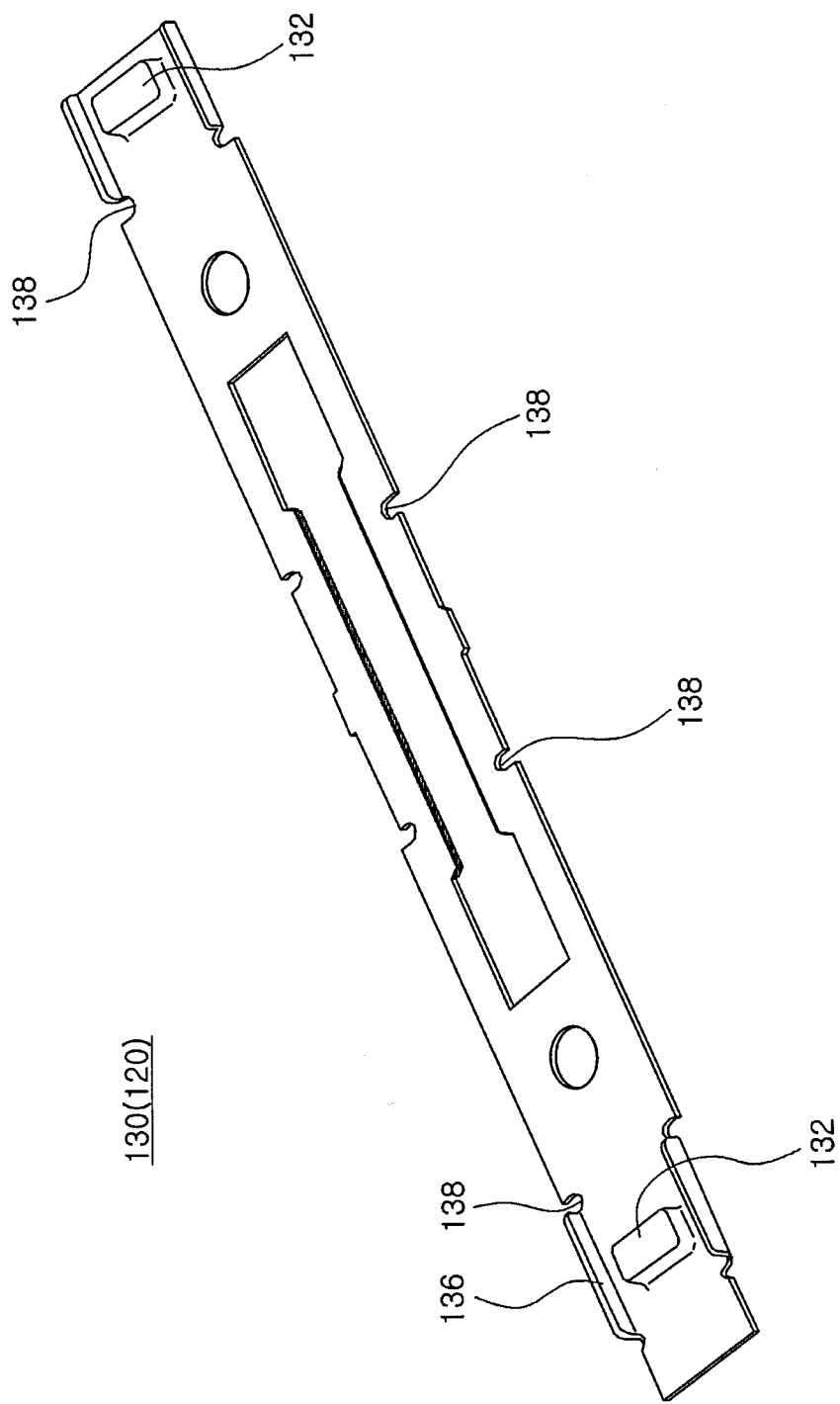
FIG. 4 is a perspective view of a lower case of the vibrator according to the embodiment of the present invention.

FIG. 4 is a perspective view of the lower case of the vibrator according to the embodiment of the present invention.

The lower case 130 may have the plate shape as shown in FIG. 4. In addition, both end portions of the lower case 130 may be provided with protrusion parts 132 supporting both end portions of the elastic member 140 (See FIG. 1). The protrusion part 132 may be formed by denting and have a square pillar shape. However, this is only an example, and the present invention is not limited thereto.

In addition, the both end portions of the lower case 130 may be provided with coupling wall parts 136 increasing coupling force with the upper case 122 (See FIG. 3).

Meanwhile, both side surfaces of the lower case 130 may be formed with a plurality of grooves 138 corresponding to the grooves 127 of the upper case 122 (See FIG. 3).

Figure 5:
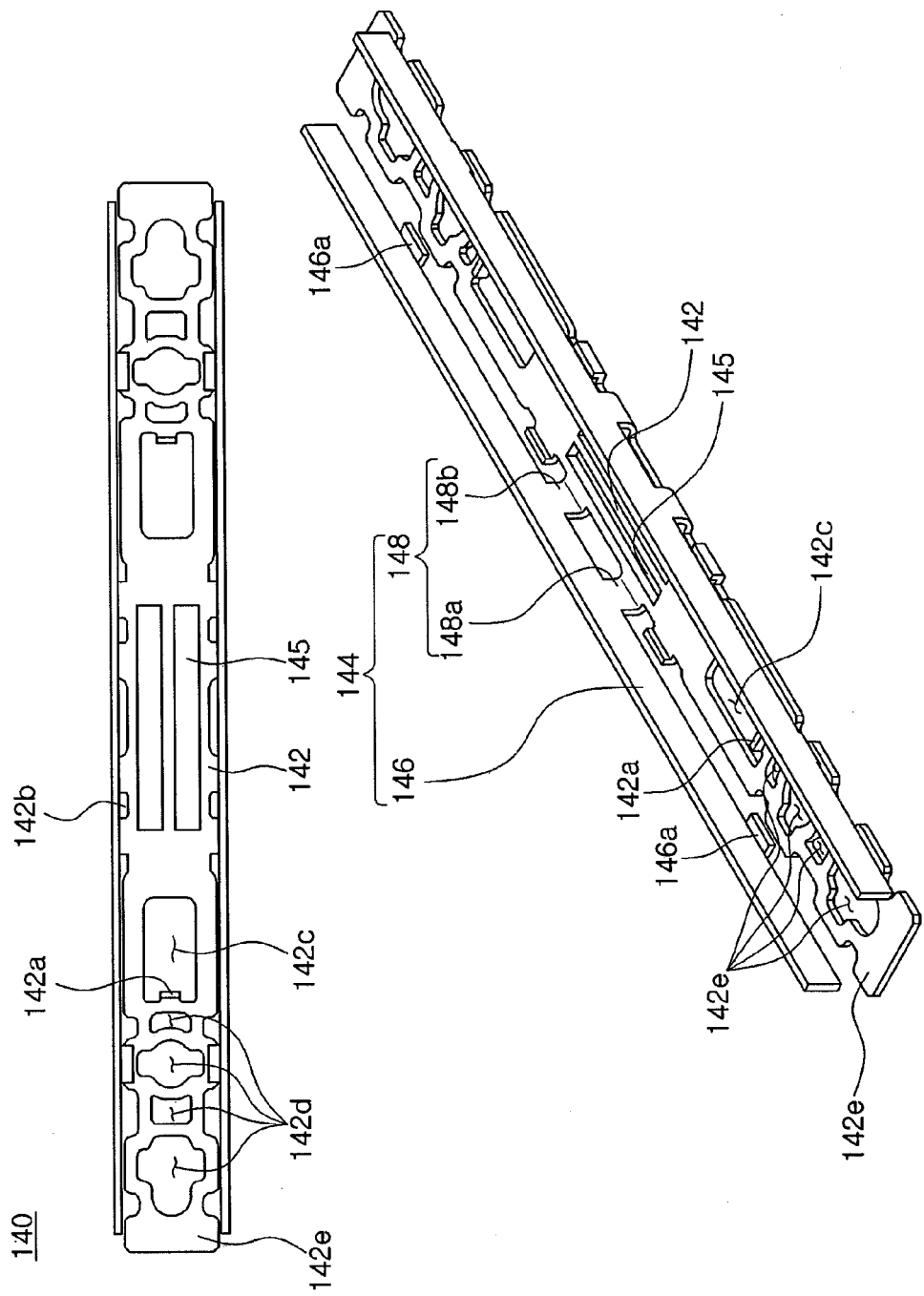
FIG. 5 is a plan view and a perspective view illustrating an elastic member of the vibrator according to the embodiment of the present invention.

FIG. 5 is a plan view and a perspective view illustrating the elastic member of the vibrator according to the embodiment of the present invention.

Referring to FIG. 5, the elastic member 140 may include a bottom plate 142 and extension plates 144. First, the bottom plate 142 of the elastic member 140 will be described. The bottom plate 142 may include a plurality of support protrusions 142a and 142b formed therefrom in order to install the piezo element 160 (See FIG. 1). Two support protrusions 142a may support both side surfaces of the piezo element 160, and the other support protrusions 142b may support the remaining two side surfaces (a front surface and a rear surface) except for both side surfaces of the piezo element 160. Therefore, the piezo element 160 may be installed at a predetermined position, and separation of the piezo element 160 from the bottom plate 142 may be prevented.

In addition, the bottom plate 142 may include opening parts 142c formed therein in order to electrically connect the circuit board 200 (See FIG. 1) and the piezo element 160 to each other.

Further, a plurality of auxiliary elastic deformation holes 142d for reducing strength may be formed between the opening parts 142c and both end portions of the bottom plate 142 so that elastic deformation of the bottom plate 142 may be easily performed. That is, the auxiliary elastic deformation hole 142d, which is a hole formed so that elastic deformation of portions adjacent to both end portions of the bottom plate 142 may be easily performed, may be provided in plural, and a shape thereof may also be variously changed.

Further, both end portions of the bottom plate 142 may be provided with support parts 142e supported by the protrusion parts 132 of the lower case 122 (See FIG. 4).

In addition, the extension plate 144 may include a support plate part 146 contacting a front surface and a rear surface of the mass body 180 and a connection part 148 connecting the support plate part 146 and the bottom plate 142 to each other.

The connection part 148 may be extended from a front surface and a rear surface of the bottom plate 142. Further, the connection part may be configured of first and second connection parts 148a and 148b disposed to be spaced apart from each other by a predetermined interval.

In addition, the support plate part 146 may be extended in a length direction of the mass body 180.

Further, a lower end of the support plate part 146 may be provided with at least one support jaw 146a protruding so as to support the mass body 180 or a mass body cover 170 at a lower portion thereof. The support jaw 146a may limit movement of the mass body 180 in the height direction. The mass body 180 or the mass body cover 170 may be coupled to the support plate part 146 by an additional bonding method such as an adhesive bonding method, a welding method, or the like, in a state in which the mass body 180 or the mass body cover 170 is caught by the support jaw 146a.

Meanwhile, portions connected to the first and second connection parts 148a and 148b in the bottom plate 142 may be damaged by external force applied to the vibrator 100. Particularly, in the case in which force is applied to the vibrator 100 in an axial direction, the portions connected to the first and second connection parts 148a and 148b in the bottom plate 142 may be easily damaged. The reason is that bending of the bottom plate 142 may not be appropriately performed in the portions connected to the first and second connection parts 148a and 148b in the bottom plate 142 due to the first and second connection parts 148a and 148b, such that stress is concentrated on the portions, which causes damage.

Therefore, in the present invention, the elastic member 140 may include a reinforcement emboss 145 protruding from a surface opposite to a surface on which the piezo actuator 160 is mounted in a central portion on which the piezo actuator 160 is mounted. That is, the reinforcement emboss 145 may be formed by pressing at least some of one surface of the elastic member 140 toward the other surface thereof.

The reinforcement emboss 145 may be continuously provided in a length direction of the elastic member and may be shorter than the piezo actuator 160 in the length direction. In addition, the reinforcement emboss 145 may be provided so as to be longer than a length between both ends of the first and second connection parts 148a and 148b in the length direction. That is, the reinforcement emboss 145 may be provided so that both ends thereof are positioned outwardly from both ends of the first and second connection parts 148a and 148b in the length direction, respectively. The reason is to prevent the portions connected to the first and second connection parts 148a and 148b in the bottom plate 142 from being damaged.

FIGS. 10A through 11C are views illustrating various examples of the elastic member of the vibrator according to the embodiment of the present invention.

Figure 10B:
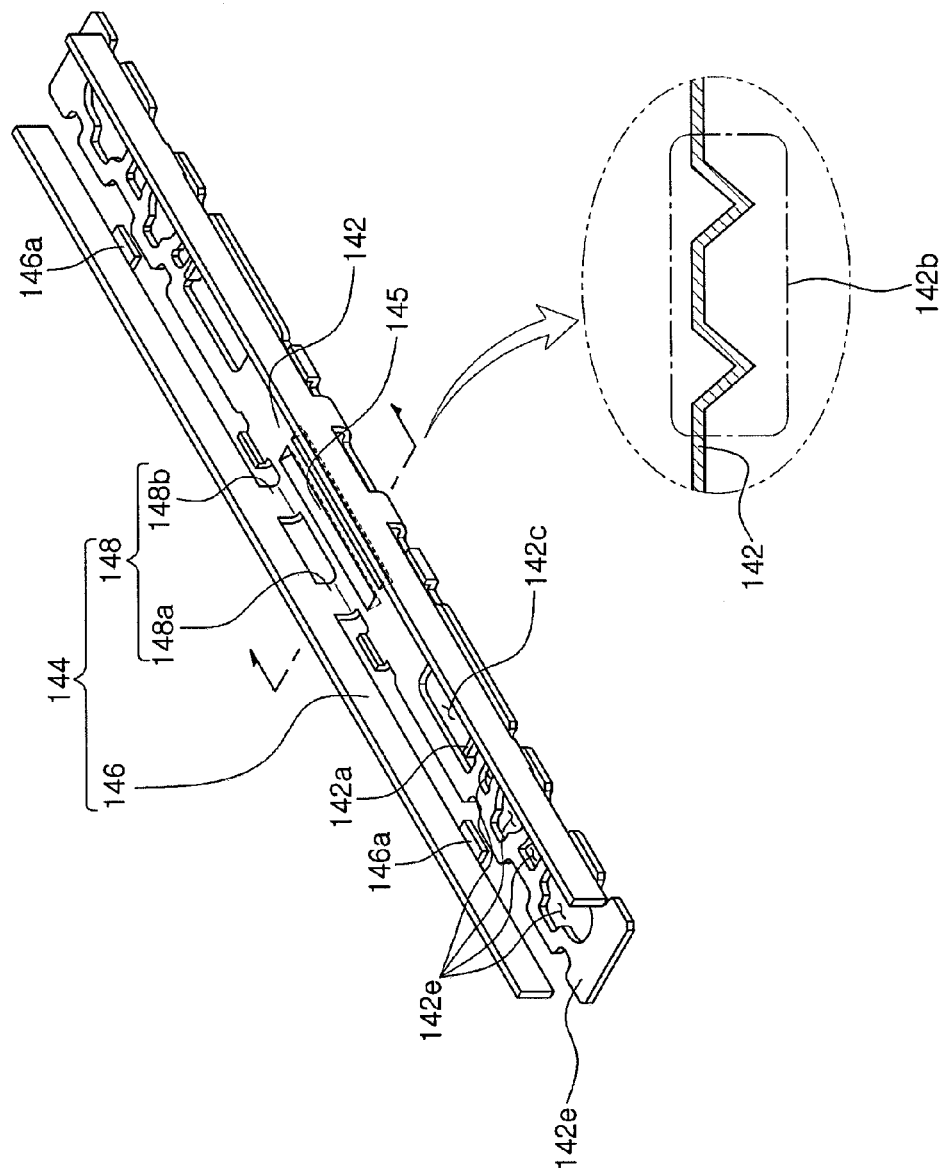
FIGS. 10A through 11C are views illustrating various examples of the elastic member of the vibrator according to the embodiment of the present invention.
Figure 10C:
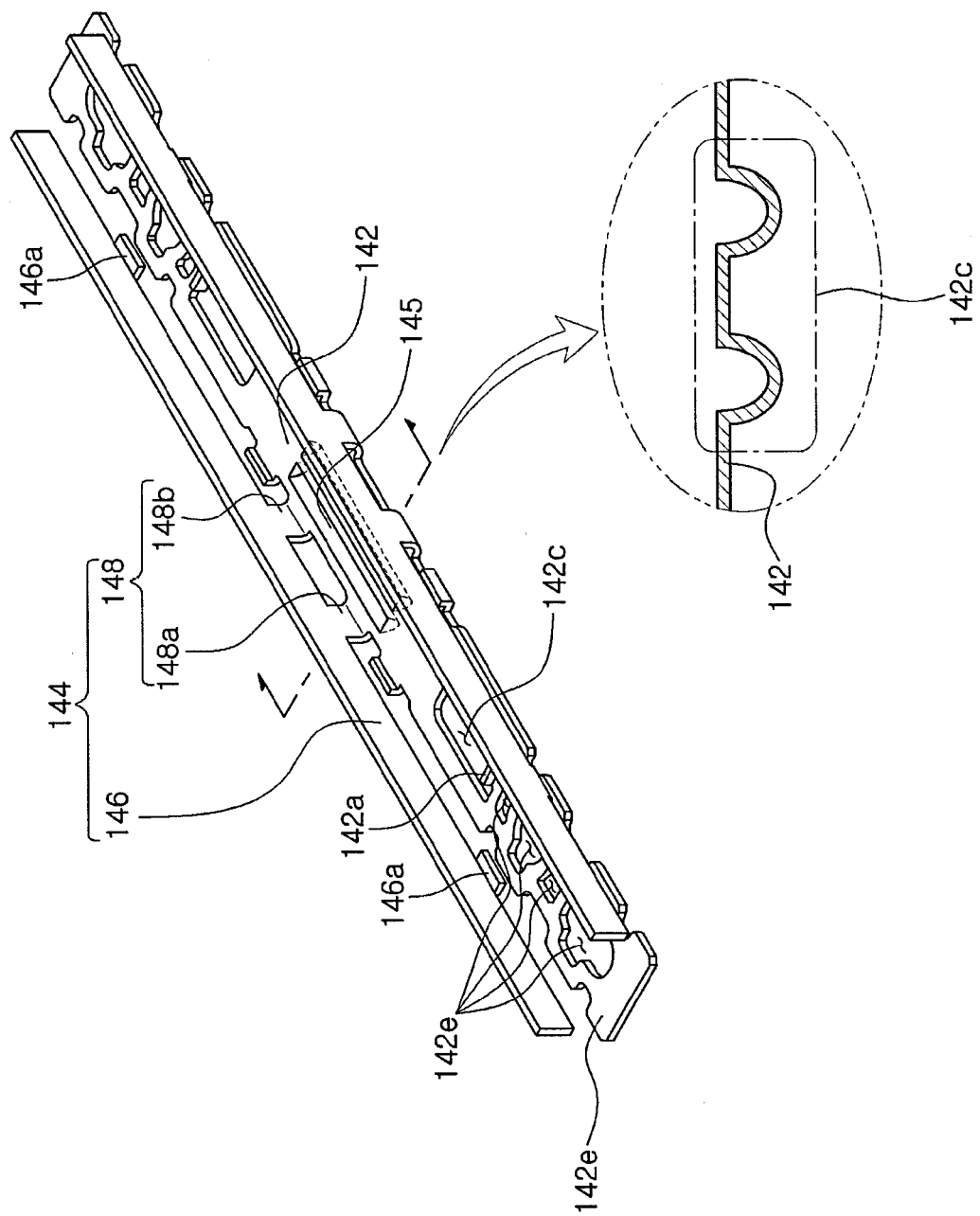

Referring to FIGS. 10A through 10C, a shape of the reinforcement emboss of the elastic member according to the embodiment of the present invention is shown. The reinforcement emboss shown FIGS. 10A through 10C may be provided along the bottom plate 142 of the elastic member 140 in the length direction. Here, a pair of the reinforcement embosses may be spaced apart from each other in the width direction and provided in parallel. However, the present invention is not limited thereto. That is, one or at least three reinforcement embosses may be provided. In this case, FIG. 10A shows an example of a reinforcement emboss 142a provided in a rectangular shape, FIG. 10B shows an example of a reinforcement emboss 142b provided having a triangular shape, and FIG. 10C shows an example of a reinforcement emboss 142b provided having a round shape.

Figure 11A:
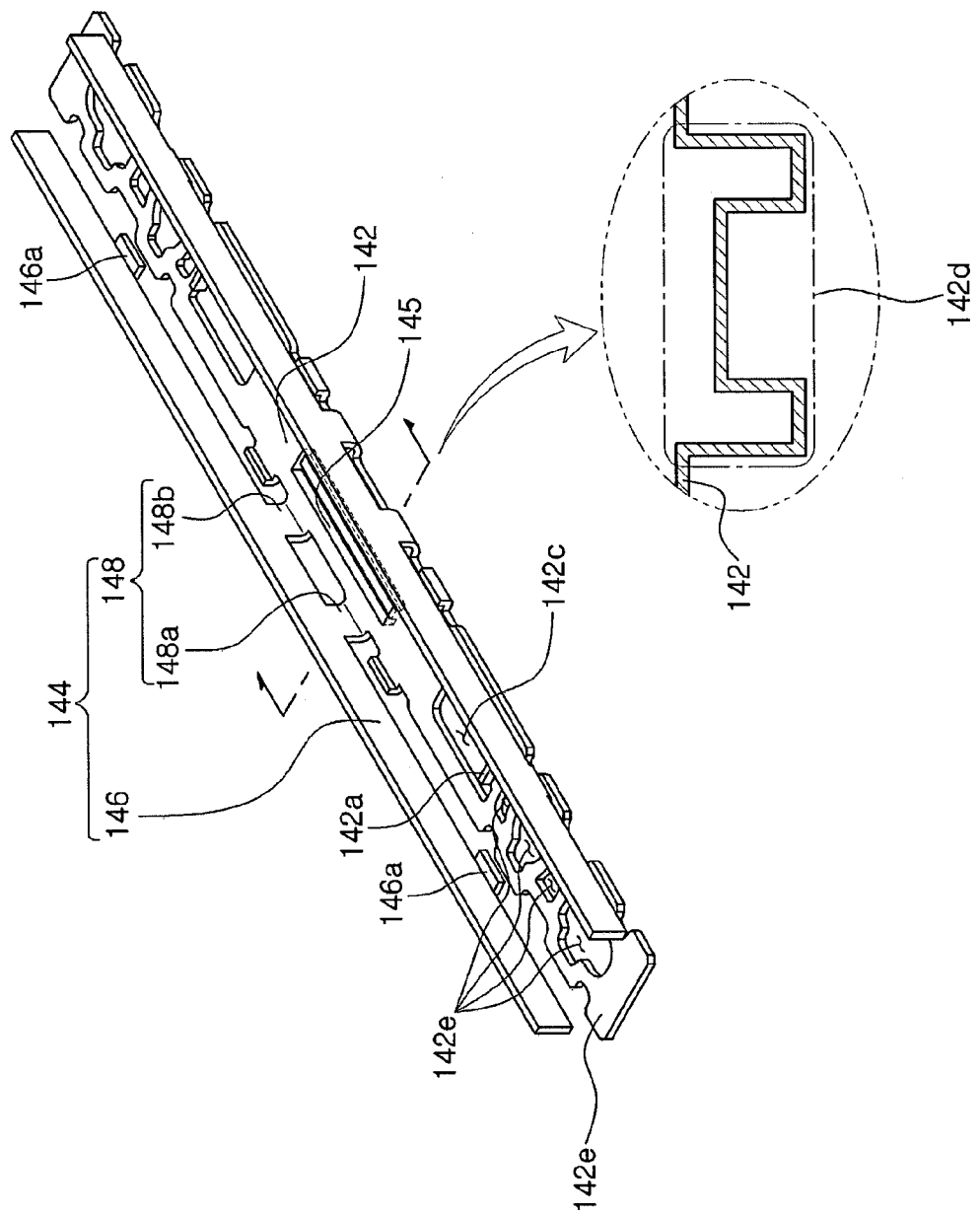
Figure 11B:
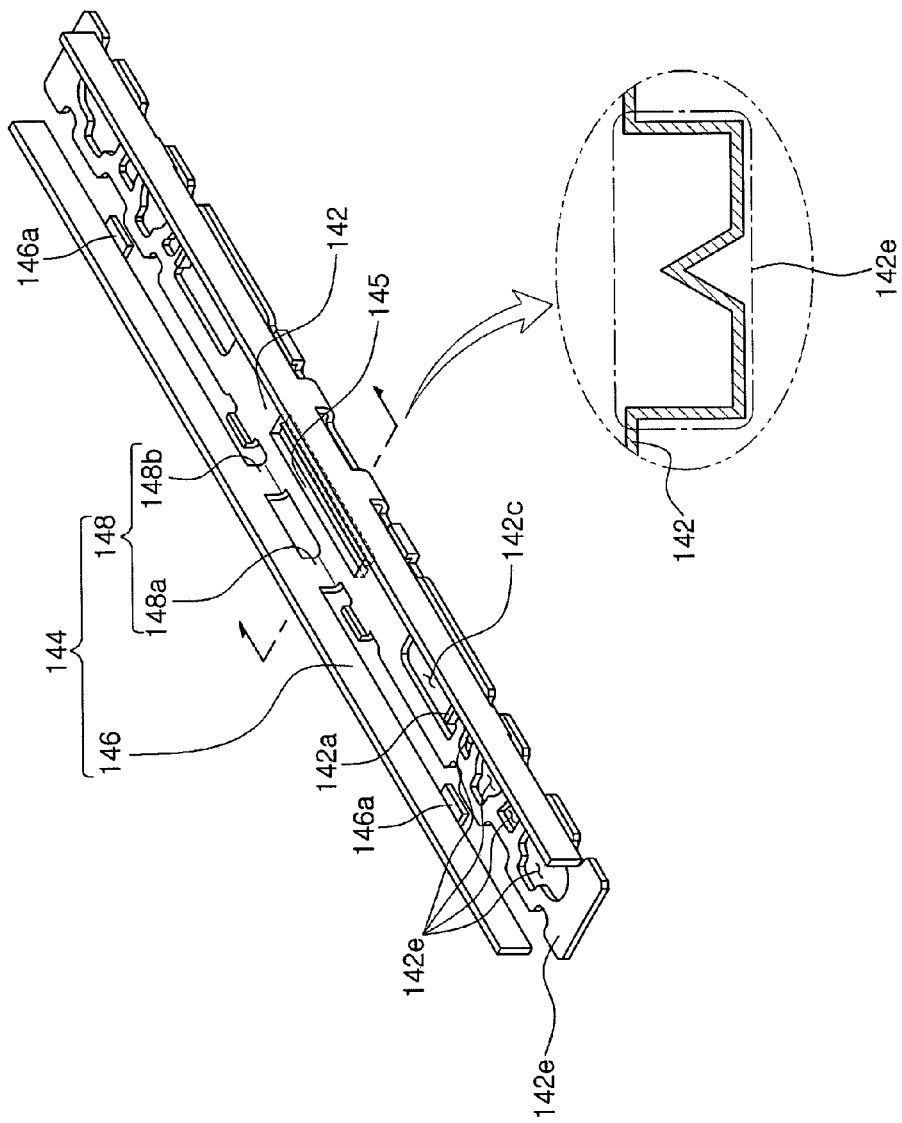
Figure 11C:
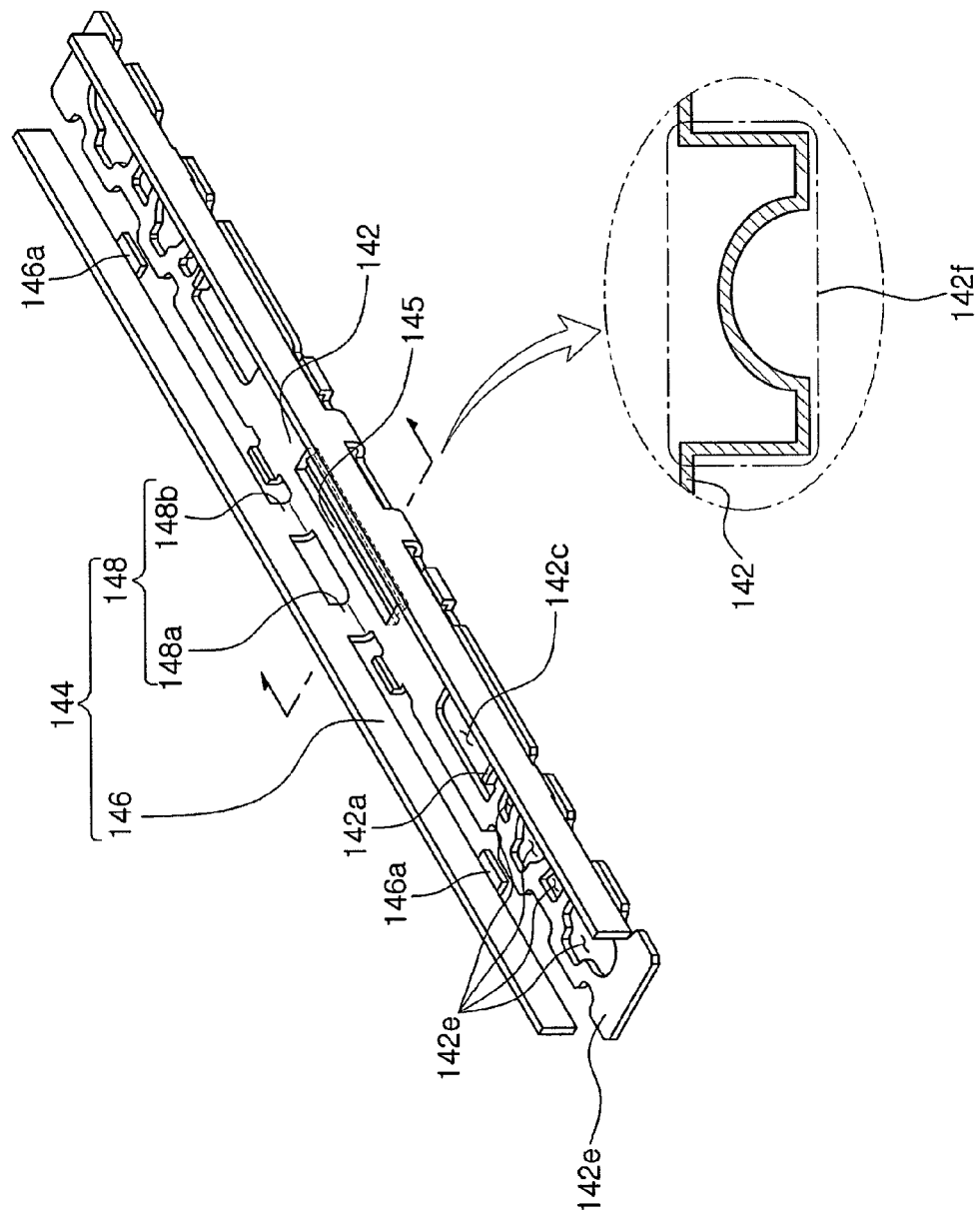

Next, referring to FIGS. 11A through 11C, a shape of the reinforcement emboss of the elastic member according to another embodiment of the present invention is shown. FIGS. 11A through 11C show an example of a reinforcement emboss doubly provided in the bottom plate 142 of the elastic member 140. That is, the reinforcement emboss may be doubly formed by performing primary compression on one surface of the bottom plate 142 and then performing secondary compression on the other surface of the primarily compressed portion. Here, the primarily compressed portion may basically have a rectangular shape, and the secondarily compressed portion may have a rectangular shape (FIG. 11A), a triangular shape (FIG. 11B), or a round shape (FIG. 11C) according to the embodiments.

Figure 6:
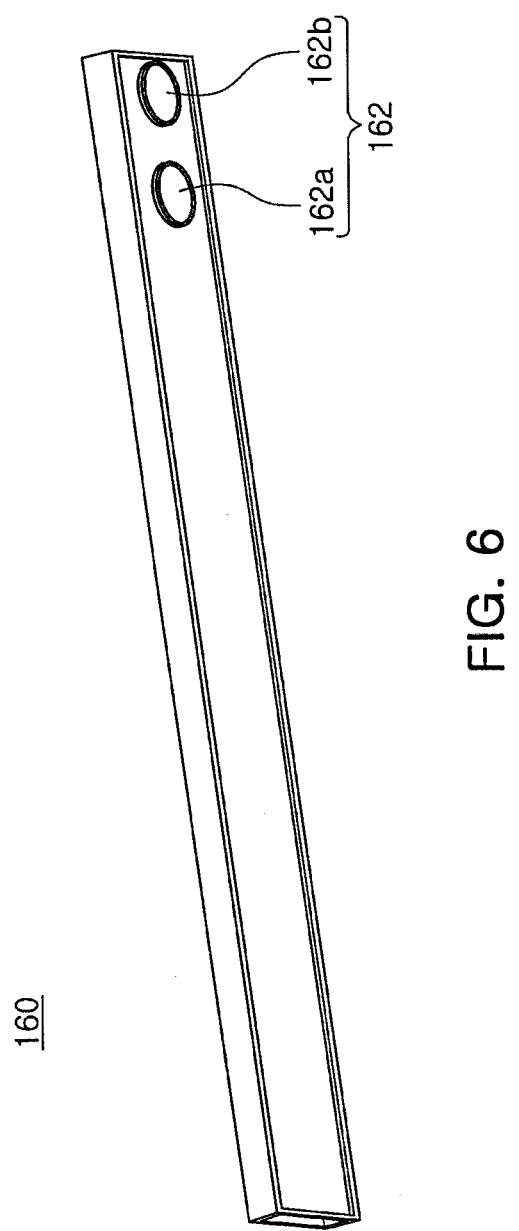
FIG. 6 is a bottom perspective view illustrating a piezo element of the vibrator according to the embodiment of the present invention.

FIG. 6 is a bottom perspective view illustrating a piezo element of the vibrator according to the embodiment of the present invention.

Referring to FIG. 6, the piezo element 160 may be fixedly installed onto the bottom plate 142 (See FIG. 5) of the elastic member 140 (See FIG. 5) as described above and have a rectangular parallelepiped shape.

In addition, a bottom surface of the piezo element 160 may be provided with an electrode 162. The electrode 162 may protrudes from the bottom surface of the piezo element 160 and be configured of a positive (+) electrode 162a and a negative (−) electrode 162b.

Figure 7:
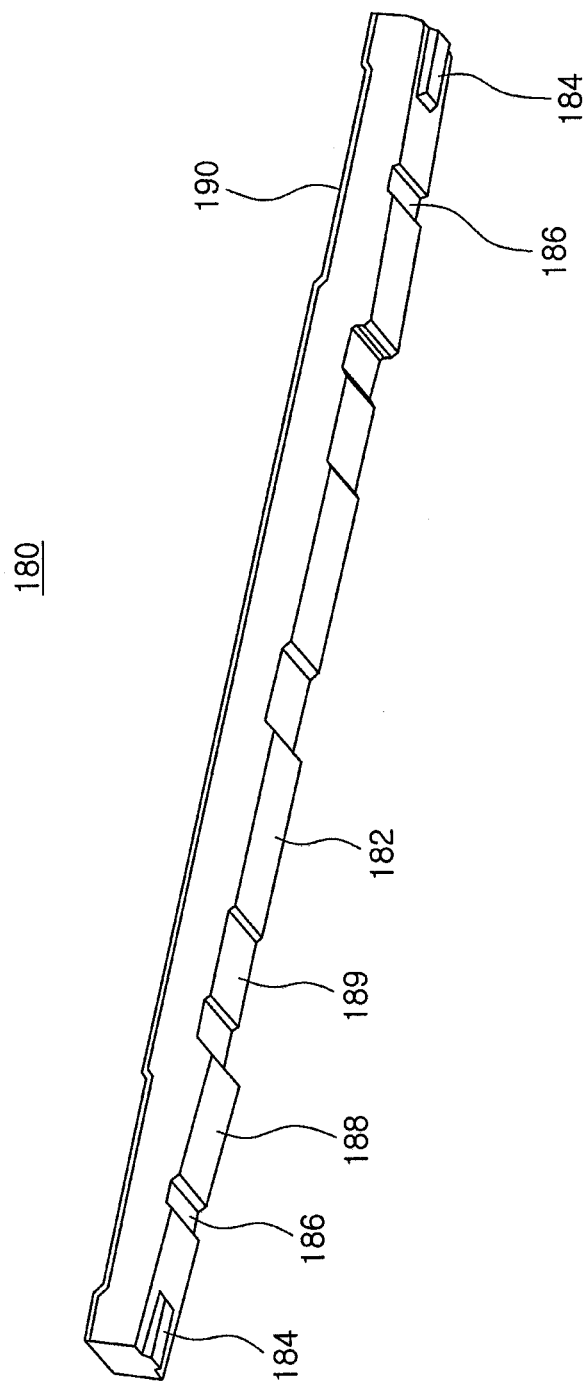
FIG. 7 is a bottom perspective view illustrating a mass body of the vibrator according to the embodiment of the present invention.

FIG. 7 is a bottom perspective view illustrating a mass body of the vibrator according to the embodiment of the present invention.

Referring to FIG. 7, the mass body 180 may have a bar shape. In addition, a bottom surface of the mass body 180 may be provided with a contact prevention groove 182 facing the piezo element 160 (See FIGS. 1 and 6).

Meanwhile, both end portions of the piezo element 160 may be provided with stopper parts 184 for limiting displacement of the mass body 180 at the time of elastic deformation of the elastic member 140 (See FIG. 4). That is, the stopper part 184 contact the end portion of the bottom plate 142 of the elastic member 140, such that displacement of the mass body 180 may be limited. Therefore, a contact between the mass body 180 and an internal region of the both end portions of the bottom plate 142 may be prevented.

Meanwhile, the mass body may include a support jaw insertion grooves 186 formed therein so as to be disposed between the stopper part 184 and the contact prevention groove 182 of the mass body 180. The mass body 180 may be installed on the elastic member 160 so that the support jaw 146a of the elastic member 140 is inserted into the support jaw insertion groove 186. In addition, an installation position of the mass body 180 in the height direction may be restricted by the support jaw 146a.

Meanwhile, the bottom surface of the mass body 180 may provided with an inclination surface 188 from the contact prevention groove 182 of the mass body 180. The inclination surface 188 may be formed to have an inclination capable of preventing a contact with the bottom plate 142 at the time of the elastic deformation of the elastic member 140. In other words, the inclination surface 188 may be formed to have an inclination equal to or less than an absolute value of an inclination of the bottom plate 142 when the bottom plate 142 is maximally deformed at the time of the elastic deformation of the bottom plate 142.

In addition, the bottom surface of the mass body 180 may be provided with a cover seat part 189 installed in a groove shape in a mass body cover 170 to be described below. Movement of the mass body 180 in the length direction may be restricted by the cover seat part 189.

Figure 8:
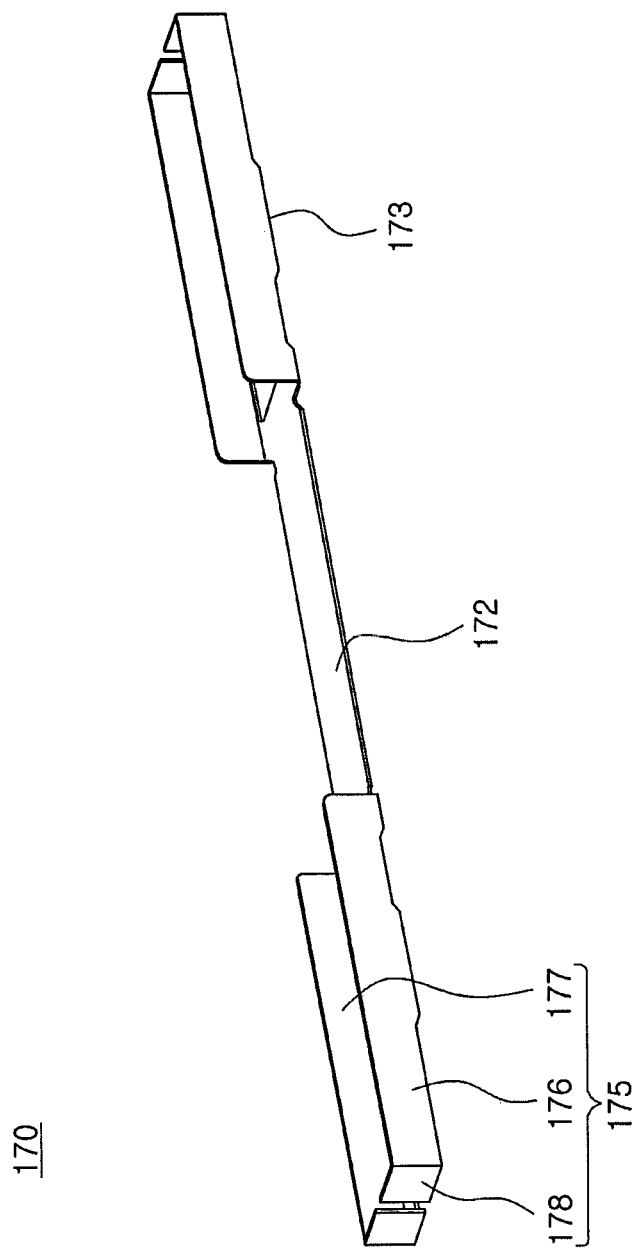
FIG. 8 is a perspective view illustrating a shape of a mass body cover of the vibrator according to the embodiment of the present invention.

FIG. 8 is a perspective view illustrating a shape of a mass body cover of the vibrator according to the embodiment of the present invention.

Referring to FIG. 8, the mass body cover 170 may be provided in a shape in which the mass body 180 may be inserted therein. That is, the mass body 180 cover may include a bottom plate 172 and an installation plate 173 supporting the bottom surface of the mass body 180 and a support plate 175 extended from the bottom plate 172 and the installation plate 173 toward the side surface of the mass body 180. The support plate 175 may be configured of front and rear support plates 176 and 177 supporting the front and rear surfaces of the mass body 180 and an end support plate 178 supporting the end portion thereof. Here, the end support plate 178 may protrude from end portions of the front and rear support plates 176 and 177 in the length direction toward the end surface of the mass body 180.

Meanwhile, the cover seat part 189 of the mass body 180 may be positioned on the installation plate 173.

In addition, although the bottom plate 172 and the installation plate 173 are discontinuously shown in the length direction in FIG. 8, the present invention is not limited thereto. The bottom plate 172 and the installation plate 173 may be provided integrally with each other to be continuously provided in the length direction.

Figure 9:
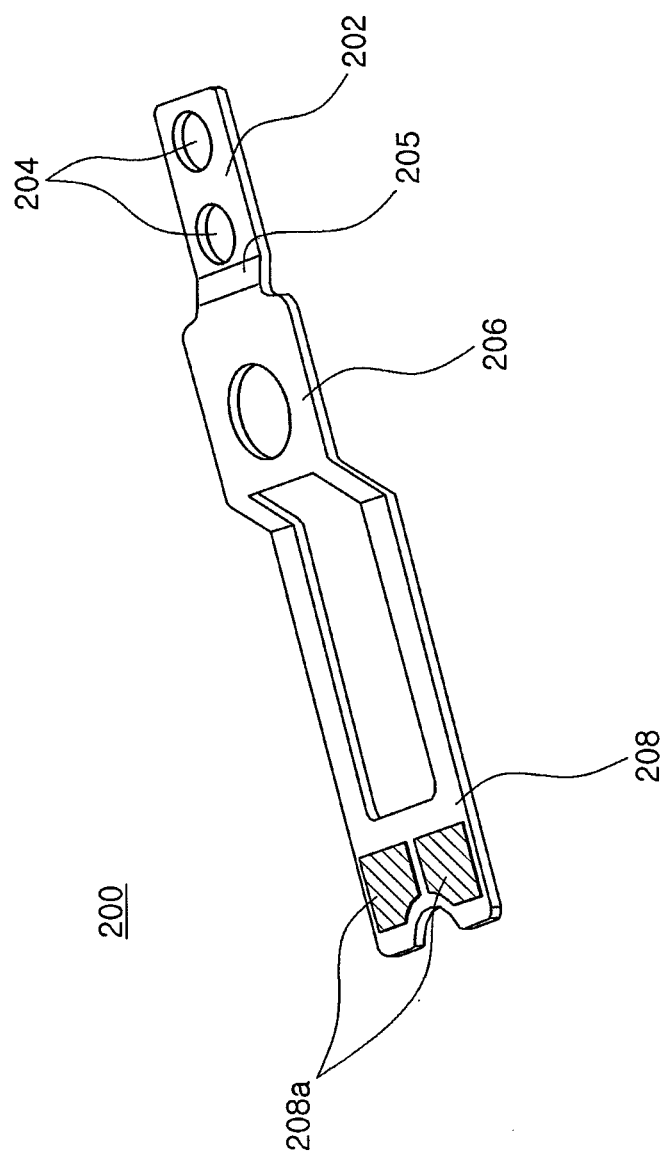
FIG. 9 is a perspective view illustrating a circuit board of the vibrator according to the embodiment of the present invention.

FIG. 9 is a perspective view illustrating a circuit board of the vibrator according to the embodiment of the present invention.

Referring to FIG. 9, the circuit board 200 may be connected to the piezo element 160 (See FIG. 1) and vibrated integrally with the elastic member 140. To this end, the circuit board 200 may include a piezo element connection part 202. Further, the piezo element connection part 202 may include insertion holes 204 formed therein so that the electrodes 162 (See FIG. 5) of the piezo element 160 are inserted thereinto.

Meanwhile, the piezo element connection part 202 may be inserted into the opening part 142c formed in the bottom plate 142 (See FIG. 4) of the elastic member 140.

Therefore, solder for connecting the piezo element 160 and the circuit board 200 to each other may be disposed in the opening part 142c of the bottom plate 142, thereby suppressing the thickness from being increased by the solder.

Further, the piezo element connection part 202 may be stepped from a body 206. To this end, the piezo element connection part 202 and the body 206 may be connected to each other by an inclination part 205. In addition, the inclination part 205 may be formed with a support protrusion insertion hole 205a into which the support protrusion 142a of the bottom plate 142 is inserted.

In addition, the body 206 may include a plurality of holes and grooves formed therein so as to be smoothly vibrated integrally with the bottom plate 142.

Further, the circuit board 200 may include a power connection terminal 208a formed thereon and an external exposure part 208 exposed to the outside of the upper case 122 (See FIG. 1). The external exposure part 208 may be stepped from the body 206.

As set forth above, according to the present invention, damage to the elastic member may be prevented by adding the simple configuration.

While the present invention has been shown and described in connection with the embodiments, it will be apparent to those skilled in the art that modifications and variations can be made without departing from the spirit and scope of the invention as defined by the appended claims.

What is claimed is:

1. A vibrator comprising:
a housing including an internal space;
an elastic member mounted within the internal space so as to be elastically deformed; and
a piezo actuator mounted on one surface of the elastic member,
wherein the elastic member includes an extension plate extending in a height direction from both edges thereof and a plurality of reinforcement embosses protruding toward a direction opposite to a direction to which the extension plate extends.

2. The vibrator of claim 1, wherein the reinforcement embosses are continuously formed in a length direction of the elastic member.

3. The vibrator of claim 1, wherein a length of each reinforcement emboss is provided so as to be shorter than a length of the piezo actuator.

4. A vibrator comprising:
a housing including an internal space;
an elastic member mounted within the internal space so as to be elastically deformed; and
a piezo actuator mounted on one surface of the elastic member, wherein
the elastic member includes a reinforcement emboss having symmetrical embossing patterns formed protruding toward a surface opposite to a surface on which the piezo actuator is mounted,
wherein the elastic member includes a bottom plate having the piezo actuator is mounted on a surface thereof and an extension plate extended in a height direction from both edges of the bottom plate in a width direction.

5. The vibrator of claim 4, wherein the extension plate includes a connection part having one end connected to the bottom plate and extended in the height direction from a central portion of the bottom plate in the length direction and a support plate part provided in the length direction at the other end of the connection part to guide a mass body.

6. The vibrator of claim 5, wherein the reinforcement emboss is provided so as to be shorter than the piezo actuator in the length direction and longer than a length between both ends of the connection part in the length direction.

7. The vibrator of claim 5, wherein the reinforcement emboss is provided so that both ends thereof are positioned outwardly from both ends of the connection part in the length direction, respectively.

8. The vibrator of claim 1, wherein each of the reinforcement embosses includes an embossing pattern symmetrical to each other.

9. The vibrator of claim 8, wherein the embossing pattern is a triangular shape.

10. The vibrator of claim 8, wherein the embossing pattern is a round shape.

11. A vibrator comprising:
a housing including an internal space;
an elastic member mounted within the internal space; and
a piezo actuator mounted on one surface of the elastic member to deform the elastic member, wherein the elastic member includes a bottom plate having the piezo actuator is mounted on a surface thereof, a connection part having one end connected to the bottom plate and extended in the height direction from a central portion of the bottom plate in a length direction, and a support plate part provided in the length direction at the other end of the connection part to guide a mass body, the bottom plate including a reinforcement emboss in the length direction so as to prevent a portion connected to the connection part in the bottom plate from being damaged.

12. The vibrator of claim 8, wherein the embossing pattern is a rectangular shape.

* * * * *